(12) United States Patent
Cheng et al.

(10) Patent No.: US 6,815,342 B1
(45) Date of Patent: Nov. 9, 2004

(54) LOW RESISTANCE METAL INTERCONNECT LINES AND A PROCESS FOR FABRICATING THEM

(75) Inventors: Chuan-cheng Cheng, Fremont, CA (US); Sethuraman Lakshminarayanan, San Jose, CA (US); Peter J. Wright, Sunnyvale, CA (US); Hong Ying, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 117 days.

(21) Appl. No.: 09/996,118

(22) Filed: Nov. 27, 2001

(51) Int. Cl.⁷ ................... H01L 21/4763; H01L 21/44
(52) U.S. Cl. ................. 438/648; 438/657; 438/687; 438/688
(58) Field of Search .................... 438/648, 656, 438/687, 688

(56) References Cited

U.S. PATENT DOCUMENTS

| | | | | |
|---|---|---|---|---|
| 5,227,335 A | * | 7/1993 | Holschwander et al. | .... 437/192 |
| 5,595,937 A | * | 1/1997 | Mikagi | ........................ 437/192 |
| 5,939,788 A | * | 8/1999 | McTeer | ........................ 257/751 |
| 5,976,975 A | * | 11/1999 | Joshi et al. | .................. 438/672 |
| 5,994,775 A | * | 11/1999 | Zhao et al. | .................. 257/751 |
| 6,054,172 A | * | 4/2000 | Robinson et al. | ............. 427/97 |
| 6,054,173 A | * | 4/2000 | Robinson et al. | ............. 427/98 |
| 6,117,782 A | * | 9/2000 | Lukanc et al. | ............. 438/692 |
| 6,126,989 A | * | 10/2000 | Robinson et al. | ............. 427/97 |
| 6,204,179 B1 | * | 3/2001 | McTeer | ....................... 438/687 |
| 6,274,486 B1 | * | 8/2001 | Rhodes et al. | ............. 438/653 |

* cited by examiner

*Primary Examiner*—Long Pham
*Assistant Examiner*—Shrinavas Rao
(74) *Attorney, Agent, or Firm*—Beyer Weaver Thomas

(57) ABSTRACT

Low resistance interconnect lines and methods for fabricating them are described herein. IC fabrication processes are used to create interconnect lines of Al and Cu layers. The Cu layer is thinner than in the known art, but in combination with the Al layer, the aggregate Cu/Al resistance is lowered to a point where it is comparable to that of a very thick Cu layer, without the additional cost and yield problems caused by using a thicker Cu deposition. Fuses for memory repair can also be fabricated using the methods taught by the present invention with only small variations in the process.

7 Claims, 4 Drawing Sheets

Combined Rs vs. Cu and Al Thickness

US 6,815,342 B1

LOW RESISTANCE METAL INTERCONNECT LINES AND A PROCESS FOR FABRICATING THEM

FIELD OF THE INVENTION

The present invention relates generally to integrated circuits (ICs) and the methods for fabricating them. More specifically, the present invention relates to the metal interconnect lines within ICs and methods for fabricating them.

BACKGROUND OF THE INVENTION

The use of copper (Cu) to fabricate interconnect lines in semiconductor devices (e.g., ICs) is known and has become increasingly common as IC feature size has decreased. Many factors have driven the switch to Cu interconnect lines, with their intrinsically low resistance per unit volume, including the decrease in IC feature size, increasing IC circuit density, the trend to lower IC operating voltages and increasing IC operating frequencies.

A known method for creating Cu interconnect lines is shown in FIGS. 1a through 1d. Before the process begins, a thick dielectric layer 11 has been deposited on the top surface of a partially formed semiconductor device 10. Dielectric layer 11 was then masked and etched, creating the channels in which Cu interconnects 13 will run. A conducting material such as Ta or TaN is then deposited as a barrier material. A thin layer of Cu can then be deposited as a seed layer to improve the uniformity of the subsequent electroplated Cu. Cu was electroplated onto the IC and then planarized by chemical-mechanical polishing (CMP) to form Cu interconnect 13. The deposition of barrier layer 15, typically composed of a dielectric material such as silicon carbide (SiC) or silicon nitride (SiN), followed by the deposition of passivation layer 17 created the structures illustrated in FIG. 1a.

As shown in FIG. 1b, after a masking step, an etching step creates an opening 16 to Cu interconnect 13. A barrier layer 18, typically formed from tantalum (Ta) or tantalum nitride (TaN) followed by an aluminum layer 19 is then deposited into opening 16 using any one of several known semiconductor processing techniques, as illustrated in FIG. 1c. Another pad masking step and another etching step follow the deposition of Al layer 19, creating the final bond pad, as shown in FIG. 11d The bond pads of the IC must still be formed from Al, as the packaging process is not mature enough to wire directly to Cu.

As FIGS. 1a through 1d only show a cross-section of the Cu interconnect lines, it should be stated that these interconnect lines form relatively long, linear structures which couple together at least two bond pads, and frequently many more bond pads. As these interconnect structures are well known, no illustration of them beyond the given cross-sections is needed to understand and implement the present invention.

In order to create a Cu interconnect of sufficient thickness to have the desired low resistance for reducing voltage drop from the power pads into the center of the die, the Cu interconnects must typically be approximately 3 to 4 microns thick. Unfortunately, the creation of such thick Cu interconnects is expensive. The deep etch and thick Cu deposition required to create such thick interconnects (FIG. 1a) is expensive and time consuming. It is also difficult to insure that Cu will fill the etched area completely to create the interconnect lines, and cracking and delaminations during the deposition process are common problems. It is also not possible to control the CMP step as precisely as is desired, and process variations can result in Cu thickness varying over 20–30% due, in particular, to dishing. To insure that the finished Cu interconnect lines have the required resistance value, they must be designed and made even thicker to compensate for the process variability. Interconnects which provide roughly the same low resistance as thick Cu, but which are easier to fabricate would be a desirable improvement.

SUMMARY OF THE INVENTION

In a first embodiment of the present invention, a method for fabricating low resistance interconnect lines in semiconductor devices is disclosed, wherein the lines are formed from a first Cu layer and a second Al layer. After the semiconductor device wafer has been prepared with Cu bond pad areas and Cu interconnect line channels, a layer of Al is deposited on both these bond areas and interconnect line channels. By adjusting the relative thickness of the Al and Cu in the interconnect lines, the resistance of the lines can be adjusted to meet particular requirements, and processing conditions can be optimized. As a two metal process is unavoidable in any case where Cu interconnects are created (the bond pads at least require an Al layer), the formation of the interconnects from both Cu and Al does not introduce any additional process complexity. The process to fabricate these lines requires no more steps than known processes to create thick Cu lines and their bond pads and uses no new materials. An additional advantage of the present invention is that fuses needed for memory repair in IC memory devices can be easily incorporated into the process flow described by the present invention.

BRIEF DESCRIPTION OF THE DRAWINGS

The invention, together with further advantages thereof, may best be understood by reference to the following description taken in conjunction with the accompanying drawings in which.

Use of the same reference number in different figures indicates similar or like elements.

DETAILED DESCRIPTION OF THE INVENTION

Reference will now be made in detail to some presently preferred embodiments of the invention. Examples of preferred embodiments are illustrated in the accompanying drawings. While the invention will be described in conjunction with these preferred embodiments, it will be understood that it is not intended to limit the invention to any particular preferred embodiment. On the contrary, it is intended to cover alternatives, modifications and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1A:
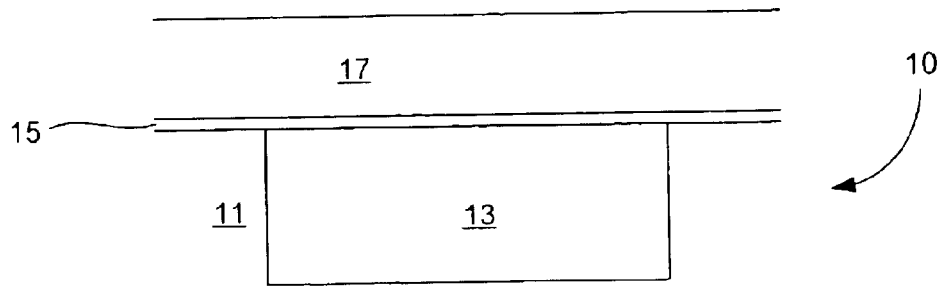
FIGS. 1a, 1b, 1c and 1d illustrate the process steps needed to fabricate interconnect lines and bond pads according to one known process (Prior Art)
Figure 1B:
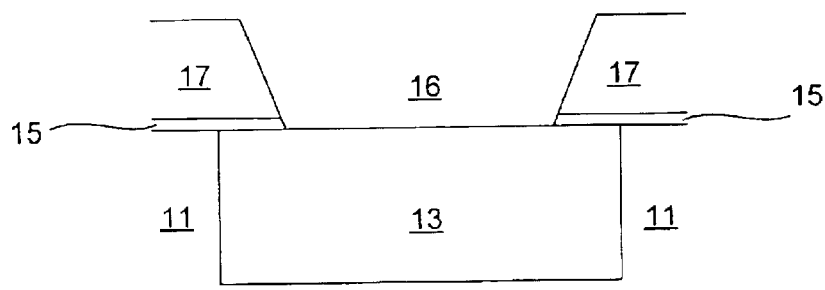
Figure 1C:
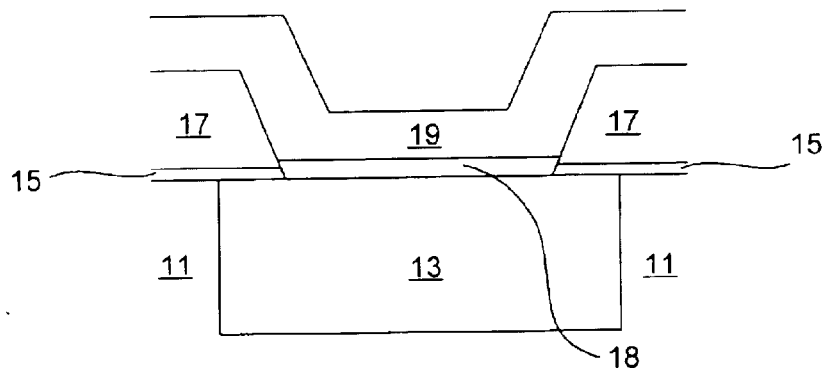
Figure 1D:
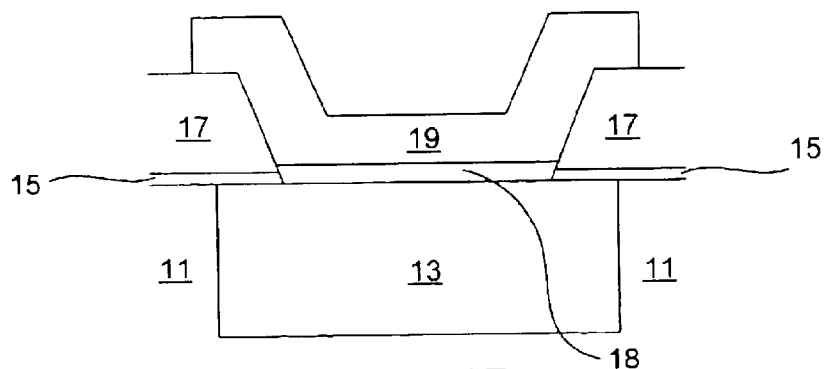
Figure 2A:
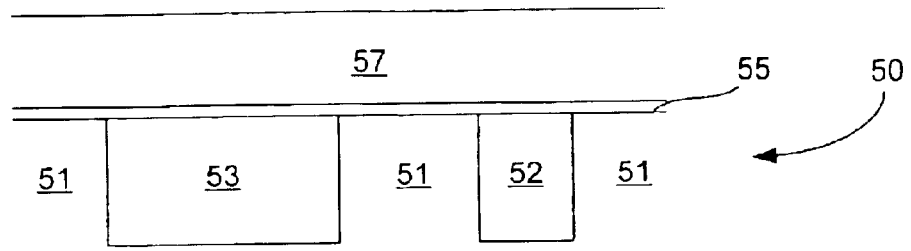
FIGS. 2a, 2b, 2c and 2d illustrate the process steps needed to fabricate interconnect lines and bond pads according to a first embodiment of the present invention.

Interconnect lines in accordance with the present invention may be formed as illustrated in the wafer cross-sections depicted in FIGS. 2a through 2d. In FIG. 2a, a thick dielectric layer 51 is deposited on the surface of a partially formed semiconductor device 50. A mask is then applied, followed by an etching of the dielectric surface, creating areas into which Cu will be deposited to create the bond pads and interconnect lines. In this first embodiment, the depth of etching to create these areas is roughly 1 micron. The resulting Cu layer's thickness will be between approximately 0.3 and 2 µm. Cu is deposited, for example by electroplating, onto the surface of semiconductor device 50, filling the etched areas. The wafer is then planarized, for example, by CMP, resulting in the creation of Cu bond pad layer 53 and Cu interconnect layer 52. Once again it is stressed that the interconnects form relatively long linear structures that couple at least two bond pads together. As the purpose and general form of interconnects is well known in the art, no illustration of this aspect of interconnects is necessary for a complete understanding of the present invention.

A relatively thin barrier layer 55 formed, for example, from Ta or TaN is then deposited. Layer 55 is typically 250 Å thick, but may be within the range of approximately 50 to 500 Å. Finally, an Al layer 57 is deposited on top of barrier layer 55. Al layer 57 is typically 1.2 µm, but may be within the range of approximately 0.5 and 3.0 µm. The resultant structure is shown in FIG. 2a.

Figure 2B:
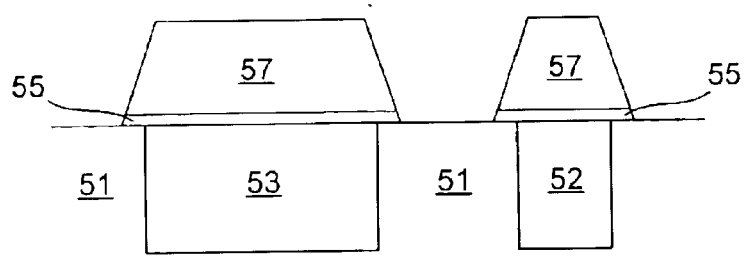

Using the same mask that was used to pattern dielectric 51 to create Cu regions 53 and 52, Al layer 57 is masked and then etched away. All Cu regions are covered with Al. As shown in FIG. 2b, the resulting semiconductor device has a dielectric layer 51, Cu bond pad layer 53 and Cu interconnect layer 52. The remaining barrier layer 55 covers Cu bond pad layer 53 and Cu interconnect layer 52. An Al bond pad layer 57 and Al interconnect layer 57 remain over Cu bond pad layer 53 and Cu interconnect layer 52.

Figure 2C:
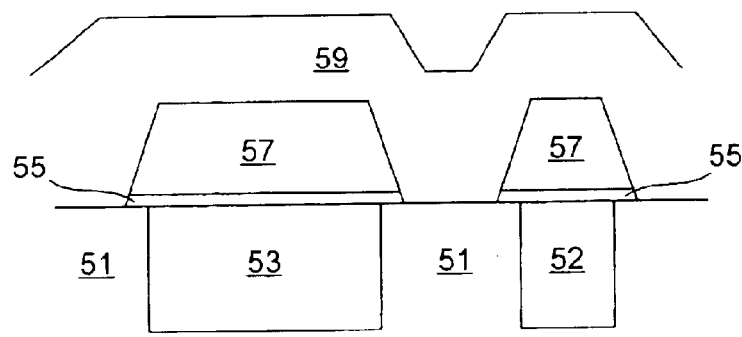
Figure 2D:
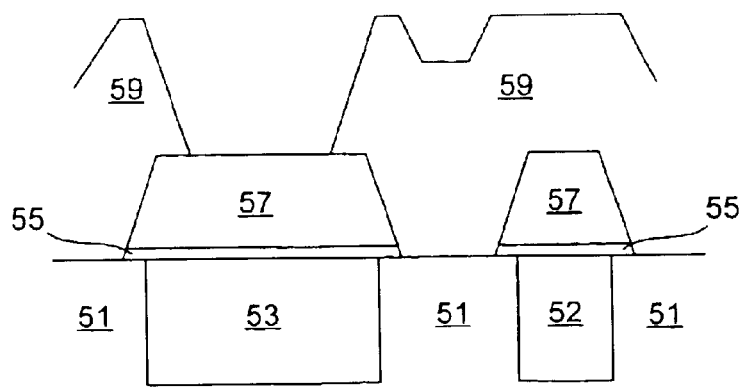

Passivation layer 59 is deposited over semiconductor device 50, as shown in FIG. 2c. Finally, passivation layer 59 is masked and etched to expose the bond pads, as shown in FIG. 2d.

This method creates interconnect lines of Cu and Al with two basic mask and etch steps. As the same mask used to fashion the Cu layer of the interconnects is used to pattern the Al layer, the cost of fabricating at least one additional mask is eliminated. By adjusting the thickness of both the Al layer and the Cu layer, the resistance of the interconnect lines can be adjusted to optimize performance, minimize process complexity, increase yield and reduce costs.

Figure 3A:
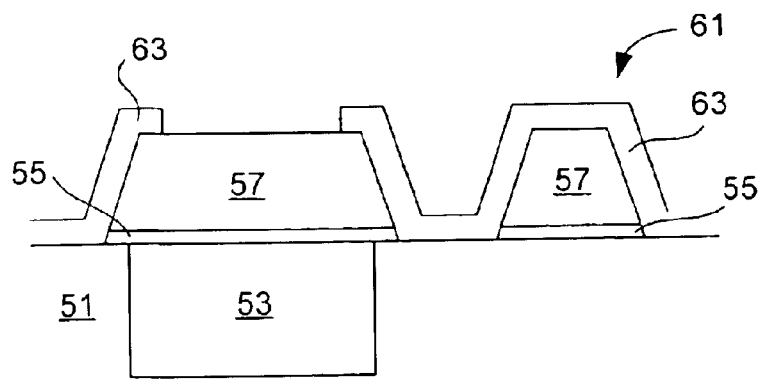
FIGS. 3a, 3b and 3c illustrate the process steps needed to fabricate interconnect lines, bond pads and fuses according to another embodiment of the present invention.
Figure 3B:
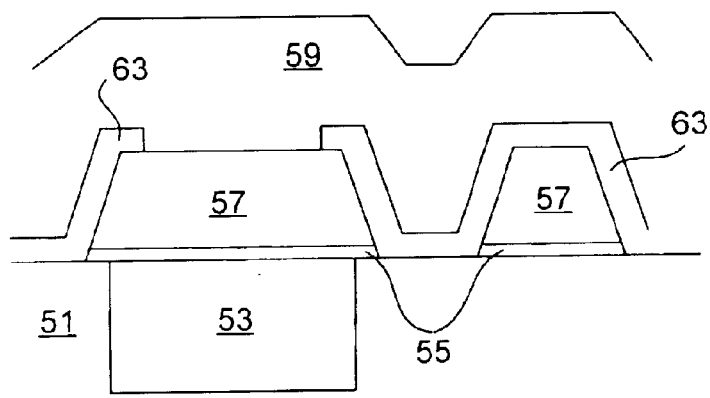
Figure 3C:
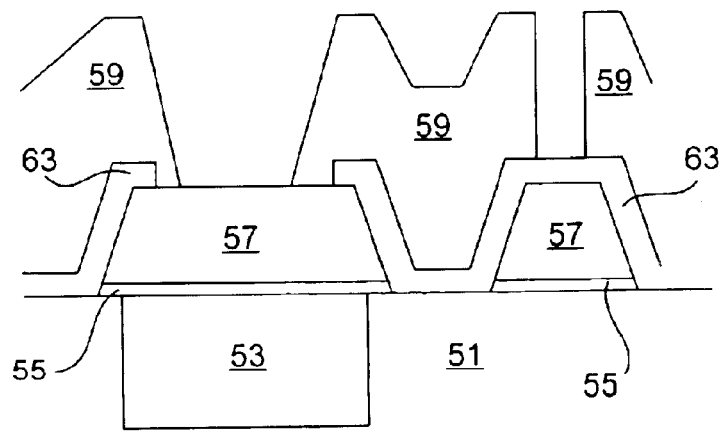

Referring now to FIGS. 3a, 3b, and 3c, the present invention can be modified to create additional Al interconnect lines and fuses for use in various IC memory designs. As shown in FIG. 3a, a semiconductor wafer has been processed in a manner similar to that which created the partially formed semiconductor device shown in FIG. 2b. A thick dielectric layer has been masked and etched, a Cu layer formed in the etched areas of the dielectric, a barrier layer deposited and an Al layer deposited over the barrier layer. The Al layer is then masked and etched, resulting in bond pad 53 and fuse area 61. Typically Cu interconnects and bond pads have slots and are not solid. The Al layer can be used to connect the separate portions or used as an interconnect. A $Si_3N_4$ nitride layer 63 is deposited, masked and etched, exposing the Al surface of bond pad 53/57, but leaving fuse 61 covered with nitride 63. Layer 63 could also be comprised of SiC or another, similar material.

FIG. 3b illustrates that a passivation layer 59 is deposited over the wafer after the $Si_3N_4$ nitride mask and etch. In a final step, illustrated in FIG. 3c, passivation layer 59 is masked and etched to expose bond pad 53/57 and fuse 61.

Figure 4:
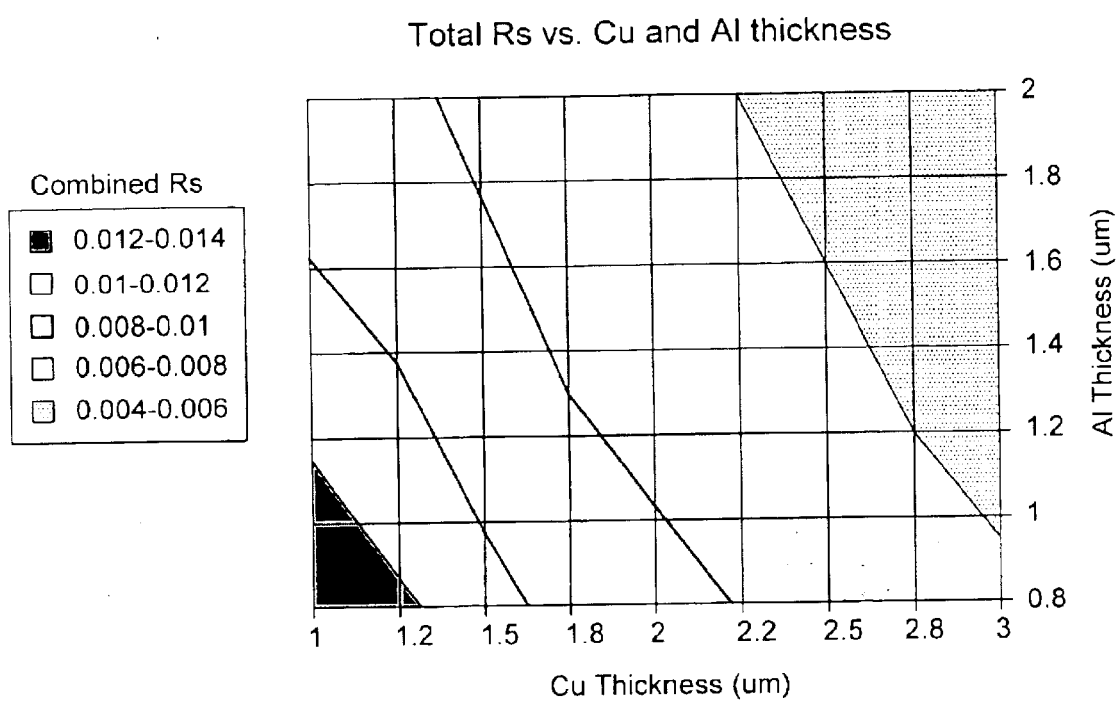
FIG. 4 is a chart illustrating the relationship of Al thickness, Cu thickness and resistance.

FIG. 4 is a graph illustrating how the thickness of Cu and Al can be independently varied according to the teachings of the present invention to fabricate interconnect lines with the desired level of resistance. A Cu thickness within the range of 0.3 to 2.0 µm, which is within the range of Cu thickness contemplated by the present invention can be overlain with an Al layer of between 0.5 microns and 3.0 µm, also well within the range of Al thickness contemplated by the present invention to create interconnects with a range of resistance per unit length of from 0.012 to 0.008 ohms. The exact choice of Cu thickness and Al thickness is a tradeoff between cost, time to fabricate and yield.

Although the present invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

We claim:

1. A method for fabricating a low resistance interconnect line in an integrated circuit, the method comprising the steps of:

forming a dielectric layer on a substrate of an integrated circuit;

patterning and etching the dielectric layer to form a trench, wherein the patterning is performed using a first photomask;

filling the trench in the dielectric layer with copper;

polishing the copper and the dielectric to form a first planarized surface comprising a top polished surface of the copper and a top polished surface of the dielectric, wherein the top polished surface of the copper and the trench define a lower conductive metal portion of the interconnect line, the lower conductive metal portion comprising copper;

depositing an aluminum layer on at least a portion of the top polished surface of the dielectric and at least a portion of the top polished surface of the copper of the first planarized surface; and patterning and etching the aluminum to define an upper conductive metal portion of the interconnect line, wherein the upper conductive metal portion is further defined so that the aluminum overlies the lower conductive metal portion and wherein the copper has a thickness within the range of 0.3 to 2.0 µm, the aluminum has a thickness within the range of 0.5 to 3.0 µm, and the thickness of the copper and the thickness of the aluminum are adjusted so that the completed interconnect line has a first predefined electrical resistance within the range of 0.012 to 0.008 Ω per unit length.

2. The method for fabricating low resistance interconnect lines as recited in claim 1 wherein the first photomask is used to pattern the aluminum layer to define the upper conductive metal portion of the interconnect using a photoresist layer having a tone reversed from that used for patterning and etching the dielectric.

3. The method for fabricating low resistance interconnect lines as recited in claim 1 wherein the low resistance interconnect comprises two layers of conductive metal over its length between a first connection point and a second connection point in the integrated circuit, wherein the lower conductive metal layer comprises copper and the upper conductive metal layer comprises aluminum.

4. The method for fabricating low resistance interconnect lines as recited in claim 1 wherein the aluminum layer is deposited directly on the first planarized surface.

5. The method for fabricating low resistance interconnect lines as recited in claim 1 further comprising depositing a barrier layer directly on the first planarized surface.

6. The method for fabricating low resistance interconnect lines as recited in claim 5 wherein the aluminum layer is deposited directly on the barrier layer.

7. The method for fabricating low resistance interconnect lines as recited in claim 5 wherein the barrier layer is at least one of Ta or TaN ranging from 0.005 to 0.050 $\mu$m in thickness.

* * * * *